US006767819B2

(12) United States Patent
Lutz (10) Patent No.: US 6,767,819 B2
(45) Date of Patent: Jul. 27, 2004

(54) APPARATUS WITH COMPLIANT ELECTRICAL TERMINALS, AND METHODS FOR FORMING SAME

(75) Inventor: Michael A. Lutz, Hope, MI (US)

(73) Assignee: Dow Corning Corporation, Auburn, MI (US)

( * ) Notice: Subject to any disclaimer, the term of this patent is extended or adjusted under 35 U.S.C. 154(b) by 106 days.

(21) Appl. No.: 09/952,738

(22) Filed: Sep. 12, 2001

(65) Prior Publication Data

US 2003/0049884 A1 Mar. 13, 2003

(51) Int. Cl.$^7$ ................................................ H01L 21/44
(52) U.S. Cl. ...................... 438/614; 438/108; 438/613; 438/612; 228/180.22
(58) Field of Search ................................ 438/108, 612, 438/613, 614; 228/180.21, 180.22, 106

(56) References Cited

U.S. PATENT DOCUMENTS

| | | | |
|---|---|---|---|
| 5,187,020 A | 2/1993 | Kwon et al. | 428/601 |
| 5,431,328 A | 7/1995 | Chang et al. | 228/180.22 |
| 5,508,228 A | 4/1996 | Nolan et al. | 437/183 |
| 5,877,556 A | 3/1999 | Jeng et al. | 257/737 |
| 6,005,292 A | 12/1999 | Roldan et al. | 257/777 |
| 6,080,494 A * | 6/2000 | Abbott | 428/621 |
| 6,333,104 B1 * | 12/2001 | Perry et al. | 428/328 |
| 6,341,071 B1 * | 1/2002 | Johnson et al. | 361/767 |
| 6,369,451 B2 * | 4/2002 | Lin | 257/779 |
| 6,396,156 B1 * | 5/2002 | Tang et al. | 257/779 |
| 6,409,073 B1 * | 6/2002 | Kaskoun et al. | 228/180.22 |
| 6,443,351 B1 * | 9/2002 | Huang et al. | 228/103 |

FOREIGN PATENT DOCUMENTS

EP 0 827 190 3/1998

OTHER PUBLICATIONS

Lau, Flip Chip Technologies, McGraw Hill, 1996, pp. 224–225.*
PCT/US02/25428 International Search Report (Aug. 12, 2003).

* cited by examiner

Primary Examiner—David A. Zarneke
(74) Attorney, Agent, or Firm—Williams, Morgan & Amerson (57) ABSTRACT

An apparatus is disclosed including an electrical conductor and an electrically conductive, compliant bump formed on the electrical conductor. The compliant bump includes an electrically conductive, solderable capping layer and an electrically conductive, compliant body positioned between the solderable capping layer and the electrical conductor. The compliant body electrically couples the solderable capping layer to the electrical conductor. The electrical conductor may be, for example, an input/output (I/O) pad of the apparatus, and the compliant bump may form an electrical terminal of the apparatus. The compliant body forms a mechanically flexible, electrically conductive path between the solderable capping layer and the electrical conductor. The compliant bump deforms elastically when subjected to a force exerted between the solderable capping layer and the electrical conductor, allowing the compliant bump to form a highly reliable connection between the apparatus and an external element. Several embodiments of the compliant bump, and methods for forming the compliant bump, are presented.

7 Claims, 6 Drawing Sheets

APPARATUS WITH COMPLIANT ELECTRICAL TERMINALS, AND METHODS FOR FORMING SAME

BACKGROUND OF THE INVENTION

This patent application is related to a co-pending patent application Ser. No. 09/952,337 (attorney reference number 3003.000800/DC10179) entitled "Semiconductor Device With Compliant Electrical Terminals, Apparatus Including The Semiconductor Device, and Methods for Forming Same" by Michael A. Lutz and filed on the same day as the present patent application.

1. Field of the Invention

This invention relates generally to electrical apparatus having terminals, and, more particularly, to electrical apparatus having area array terminals for forming electrical connections.

2. Description of the Related Art

During manufacture of an integrated circuit, signal lines that are formed upon a silicon substrate and which are to be ultimately connected to external devices, are terminated at flat metal contact regions called input/output (I/O) pads. Following manufacture, the integrated circuit (i.e., chip) is typically secured within a protective semiconductor device package. Each I/O pad of the integrated circuit is then connected to one or more electrical terminals of the device package.

The electrical terminals of a device package are typically arranged either about a periphery of the package, or in a two-dimensional array across an underside surface of the package. Metal conductors are typically used to connect the I/O pads of the integrated circuit to the terminals of the device package. The metal conductors may be, for example, fine metal bond wires, "traces" (i.e., signal lines) formed on and/or within a substrate of the device package, traces formed on and/or within a flexible carrier film or laminate such as a tape automated bonding or TAB tape, or a lead frame. Peripheral terminal device packages may have, for example, terminals called "pins" for insertion into holes in a printed circuit board (PCB), or terminals called "leads" for attachment to flat metal contact regions on an exposed surface of a PCB. Area array terminal device packages typically have solder "balls" or "bumps" for attachment to flat metal pads on an exposed surface of a PCB.

Area array terminal packages have terminals arranged in a two-dimensional array across the underside surface of the device package. As a result, the physical dimensions of area array terminal packages having hundreds of terminals are much smaller than their peripheral terminal counterparts. Such smaller packages are highly desirable in portable device applications such as laptop and palmtop computers and hand-held communications devices such as cellular telephones. In addition, the lengths of signal lines from integrated circuit I/O pads to device package terminals are shorter, thus the high frequency electrical performances of grid array device packages are typically better than those of corresponding peripheral terminal device packages.

Controlled collapse chip connection (C4) is a well known method of attaching an integrated circuit directly to a substrate (e.g., fiberglass-epoxy printed circuit board material or a ceramic substrate). The C4 attachment method is commonly referred to as the "flip chip" attachment method. In preparation for C4 attachment, the I/O pads of the integrated circuit are typically arranged in a two-dimensional array upon an underside surface of the integrated circuit, and a corresponding set of bonding pads are formed upon an upper surface of the substrate. A solder "bump" is formed upon each of the I/O pads of the integrated circuit. For example, several layers of constituent metals of a solder alloy may be deposited on the I/O pads of the integrated circuit. Following deposition of the metal layers, the integrated circuit may be heated to melt the metal layers. The molten metals may mix together to form the solder alloy, and the surface tension of the solder alloy may cause the molten solder alloy to form hemispherical solder "bumps" on the I/O pads of the integrated circuit. Solder paste is typically deposited upon each of the bonding pads of the substrate.

During C4 attachment of the integrated circuit to the substrate, the solder bumps on the I/O pads of the integrated circuit are placed in physical contact with the solder paste on the corresponding bonding pads of the substrate. The substrate and the integrated circuit are then heated long enough for the solder to melt or "reflow." When the solder cools, the I/O pads of the integrated circuit are electrically and mechanically coupled to the bonding pads of the substrate.

A popular type of area array terminal device package is the "flip chip" ball grid array (BGA) device package. A typical "flip chip" BGA device package includes an integrated circuit mounted upon an upper surface of a larger package substrate using the C4 or "flip chip" attachment method described above. The substrate includes two sets of bonding pads: a first set arranged on the upper surface adjacent to the integrated circuit, and a second set arranged in a two-dimensional array across an underside surface of the BGA device package. One or more layers of electrically conductive traces (i.e., signal lines) formed on and/or within the substrate connect respective members of the first and second sets of bonding pads. Members of the second set of bonding pads function as device package terminals. A solder ball is attached to each member of the second set of bonding pads. The solder balls allow the BGA device package to be surface mounted to an ordinary PCB.

A problem arises in that the coefficients of thermal expansion (CTEs) of the integrated circuit and the package substrate typically differ. This difference in CTEs creates mechanical stresses within the solder bumps during the solder reflow operation described above. Further, following attachment of the integrated circuit to the package substrate, the integrated circuit heats up while dissipating electrical power during operation, and cools down when not operating. Again, the difference in the CTEs of the integrated circuit and the package substrate creates mechanical stresses within the solder bumps during the resultant thermal cycling. Left unchecked, these mechanical stresses typically cause the solder bump connections to fatigue and fail after an unacceptably small number of thermal cycles.

A common solution to the above described CTE mismatch problem is to form a layer of an underfill material in the region between the integrated circuit and the substrate during a final portion of the "flip chip" attachment process. The underfill material encapsulates the C4 connections and mechanically "locks" the chip to the substrate, reducing mechanical stresses in the solder bump connections during thermal cycling, thereby significantly increasing the reliabilities of the solder bump connections.

A problem arises in that rework of such underfilled integrated circuit device packages is very difficult. In addition, the underfill process is time consuming, and constitutes a process the semiconductor device manufacturing industry would like to eliminate.

The present invention is directed to compliant electrical terminals which may be used to achieve highly reliable electrical connections despite CTE mismatches (e.g., between integrated circuits and package substrates), and without the required use of an underfill material.

SUMMARY OF THE INVENTION

An apparatus is disclosed including an electrical conductor and an electrically conductive, compliant bump formed on the electrical conductor. The compliant bump includes an electrically conductive, solderable capping layer and an electrically conductive, compliant body positioned between the solderable capping layer and the electrical conductor. In general, the solderable capping layer may be broadly described as "solder wettable." In particular, the solderable capping layer may include one or more of the following metals: lead, tin, cadmium, indium, bismuth, gallium, copper, silver, platinum, palladium, and nickel. The compliant body electrically couples the solderable capping layer to the electrical conductor.

The electrical conductor may be, for example, an input/output (I/O) pad of the apparatus, and the compliant bump may form an electrical terminal of the apparatus. The compliant body forms a mechanically flexible, electrically conductive path between the solderable capping layer and the electrical conductor. The compliant bump deforms elastically when subjected to a force exerted between the solderable capping layer and the electrical conductor. That is, a shape of the complaint bump changes from an original shape to an altered shape when the compliant bump is subjected to a force exerted between the solderable capping layer and the electrical conductor (e.g., when the compliant bump is compressed, stretched, expanded, etc.). The shape of the compliant bump substantially reverts to the original shape when the force is removed. This ability to deform elastically allows the compliant bump to form a highly reliable connection between the apparatus and corresponding bonding pads of an external element.

The compliant body may include, for example, a polymer based material. Polymer based materials believed to be suitable include epoxy, silicone, polyimide, and acrylate polymers and copolymers. The compliant body may also include one or more filler materials such as silver, gold, or palladium, or alloys thereof. Such filler materials may be used to increase the electrical conductivity of the compliant body. The solderable capping layer may be an alloy including at least two of the following metals: lead, tin, cadmium, indium, bismuth, and gallium. The compliant body may be in direct contact with the solderable capping layer and the electrical conductor.

In one embodiment, the apparatus includes a substrate, multiple I/O pads arranged on a surface of the substrate, and multiple copies of the above described electrically conductive, compliant bumps, wherein each of the compliant bumps is formed on a different one of the I/O pads. The apparatus may be, for example, an integrated circuit die, and the substrate may be a semiconductor substrate. Alternately, the apparatus may be a printed circuit board, and the substrate may be a fiberglass epoxy laminate. Further, the apparatus may be an interconnecting apparatus (e.g., a device package substrate), and the substrate may include a plastic material (e.g., fiberglass epoxy laminate, polyethersulfone, or polyimide), or a ceramic material (e.g., aluminum oxide, alumina, $Al_2O_3$, or aluminum nitride, AlN).

A disclosed method for forming a compliant electrical terminal on an upper surface of an electrical conductor (e.g., an I/O pad) includes forming the above described electrically conductive, compliant body over the upper surface of the electrical conductor such that the compliant body is electrically coupled to the electrical conductor. The above described electrically conductive, solderable capping layer is formed over the compliant body such that the solderable capping layer is electrically coupled to the compliant body.

During the forming of the compliant body, an underside surface of the compliant body may be in direct contact with the upper surface of the electrical conductor, and the compliant body may be electrically coupled to the electrical conductor as a result of the direct contact. An outer boundary of the compliant body may extend beyond an outer boundary of the electrical conductor. This may serve to increase the cross sectional area of the compliant bump, thereby increasing the electrical conductivity of the complaint body. The increased cross sectional area may also increase dimensions of regions within the complaint body 106 in which thermo-mechanically induced stresses are elastically dissipated.

In one embodiment of the method, an electrically conductive metal coating is formed over the upper surface of the electrical conductor such that the conductive metal is electrically coupled to the electrical conductor. An outer boundary of the conductive metal coating extends beyond an outer boundary of the electrical conductor. The conductive metal coating functions as either an adhesion layer or a barrier layer. The compliant body is formed over the conductive metal coating such that the compliant body is electrically coupled to the conductive metal coating.

In another embodiment of the method, an electrically conductive metal coating is formed over the compliant body such that the conductive metal coating is electrically coupled to the compliant body. An outer boundary of the conductive metal coating extends beyond an outer boundary of the compliant body. The conductive metal coating functions as either an adhesion layer or a barrier layer. The solderable capping layer is formed over the conductive metal coating such that the solderable capping layer is electrically coupled to the conductive metal coating.

BRIEF DESCRIPTION OF THE DRAWINGS

The invention may be understood by reference to the following description taken in conjunction with the accompanying drawings, in which like reference numerals identify similar elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
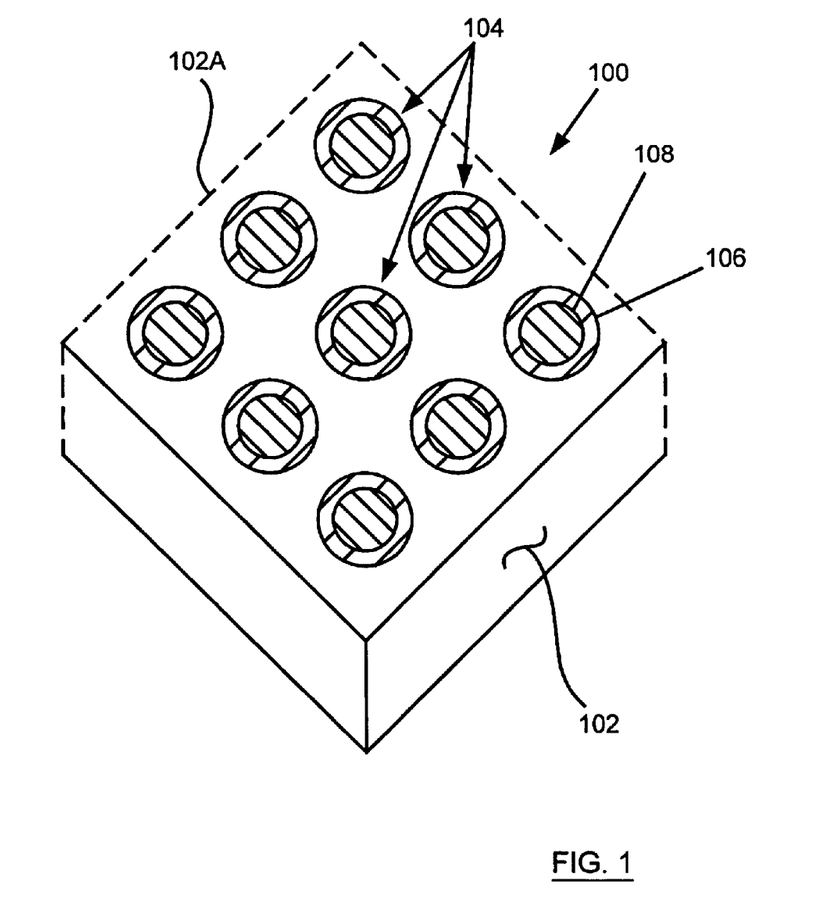
FIG. 1 is a perspective view of a portion of an apparatus including a substrate and multiple electrically conductive, compliant bumps arranged upon a surface of the substrate, wherein each of the compliant bumps includes an electrically conductive, compliant body, and an electrically conductive, solderable capping layer.

FIG. 1 is a perspective view of a portion of an apparatus 100 including a substrate 102, wherein multiple electrically conductive, compliant bumps 104 are arranged upon a surface 102A of the substrate 102. As will be described below, each of the compliant bumps 104 is positioned over a different one of multiple input/output (I/O) pads (not shown in FIG. 1) of the apparatus 100. The I/O pads terminate electrical power and/or signal lines of the apparatus 100, and are intended for connection to circuits external to the apparatus 100. The compliant bumps 104 form electrical terminals of the apparatus 100.

The apparatus 100 may be, for example, an integrated circuit die, and the substrate 102 may be a semiconductor substrate. During manufacture, the integrated circuit die may have been a part of a much larger semiconductor wafer. The compliant bumps 104 may have been formed on the integrated circuit die during manufacture, and before the integrated circuit die was separated from the larger semiconductor wafer.

Alternately, the apparatus 100 may be an interconnecting apparatus, such as a printed circuit board or a grid array package substrate. In this situation, the substrate 102 may be substantially formed from, for example, a plastic material (e.g., fiberglass epoxy laminate, polyethersulfone, or polyimide), or a ceramic material (e.g., aluminum oxide, alumina, $Al_2O_3$, or aluminum nitride, AlN). The apparatus 100 may also be part of a multichip module, or a glass liquid crystal display.

Each of the compliant bumps 104 includes an electrically conductive, compliant body 106 and an electrically conductive, solderable capping layer 108. The compliant body 106 of each of the compliant bumps 104 is formed over an I/O pad of the apparatus 100, and the solderable capping layer 108 is formed over the compliant body 106. The compliant body 106 of each of the compliant bumps 104 is thus positioned between the I/O pad of the apparatus 100 and the corresponding capping layer 108, and electrically couples the I/O pad to the corresponding solderable capping layer 108.

The solderable capping layers 108 of the compliant bumps 104 are intended to contact corresponding bonding pads of an element (e.g., a printed circuit board, a device package substrate, an integrated circuit die, etc.) to which the apparatus 100 is to be connected (i.e., attached or mounted). Hereinbelow, the element to which the apparatus 100 is to be connected will be referred to as "the connected element." In general, the solderable capping layers 108 are "solder wettable." That is, molten solder coming in contact with exposed surfaces of the solderable capping layers 108 will adhere to those surfaces, thus allowing solder to be used to electrically and mechanically couple the solderable capping layers 108 to the corresponding bonding pads. A solder reflow operation may be used to couple the solderable capping layers 108 of the compliant bumps 104 to the corresponding bonding pads of the connected element via solder at substantially the same time.

Due primarily to the presence of the compliant bodies 106, the compliant bumps 104 are able to deform elastically when subjected to forces exerted between solderable capping layers 108 and the substrate 102. Such forces may be intentionally created between the apparatus 100 and an element to which the apparatus 100 is to be connected during the coupling of the solderable capping layers 108 to the corresponding bonding pads of the connected element in an effort to reduce or eliminate gaps existing between some of the solderable capping layers 108 and the corresponding bonding pads. Such gaps typically result from differences in heights of the solderable capping layers 108, non-planarities of surfaces of the substrate 102 and/or the connected element, etc.

Such forces are also expectedly created when the coefficient of thermal expansion (CTE) of the apparatus 100 does not match the CTE of the connected element. For example, during a solder reflow operation used to couple the solderable capping layers 108 to the corresponding bonding pads of the connected element, such forces are expectedly created due to the differences in the CTEs of the apparatus 100 and the connected element. Following the coupling of the solderable capping layers 108 to the corresponding bonding pads, such forces are also expectedly created during thermal cycling due to the differences in the CTEs of the apparatus 100 and the connected element.

The abilities of the compliant bumps 104 to deform elastically under such forces allows the compliant bumps 104 to withstand such forces without the fatigue and failure typical of solder bump connections. The compliant bodies 106 form mechanically flexible, electrically conductive paths between the solderable capping layers 108 and the corresponding I/O pads of the apparatus 100. As a result, the reliabilities of the connections formed between the apparatus 100 and the connected element using the compliant bumps 104 are expectedly greater than the reliabilities of solder bump connections.

It is noted that the compliant bumps 104 may be arranged in any suitable manner upon one or more surfaces of the substrate 102.

Figure 2A:
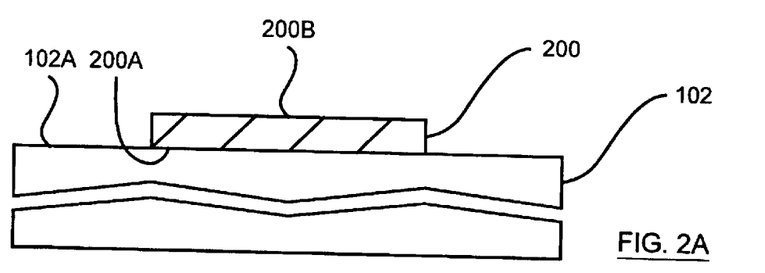
FIG. 2A is a cross-sectional view of a portion of the substrate of FIG. 1, wherein an input/output (I/O) pad has been formed on the surface of the portion of the substrate.
Figure 2B:
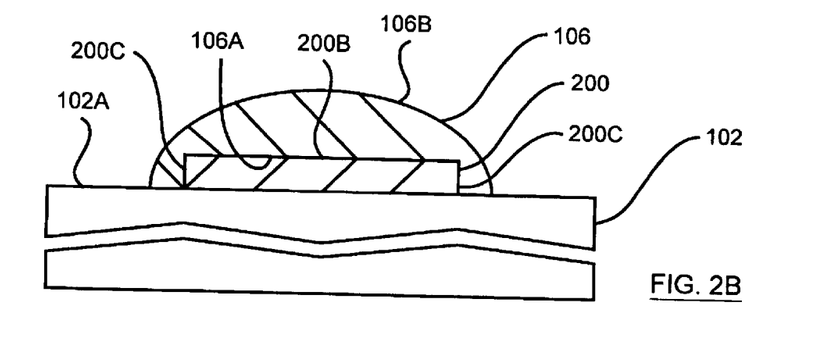
FIG. 2B is the cross-sectional view of the portion of the substrate of FIG. 2A, wherein the compliant body of FIG. 1 has been formed over an upper surface of the I/O pad.
Figure 2C:
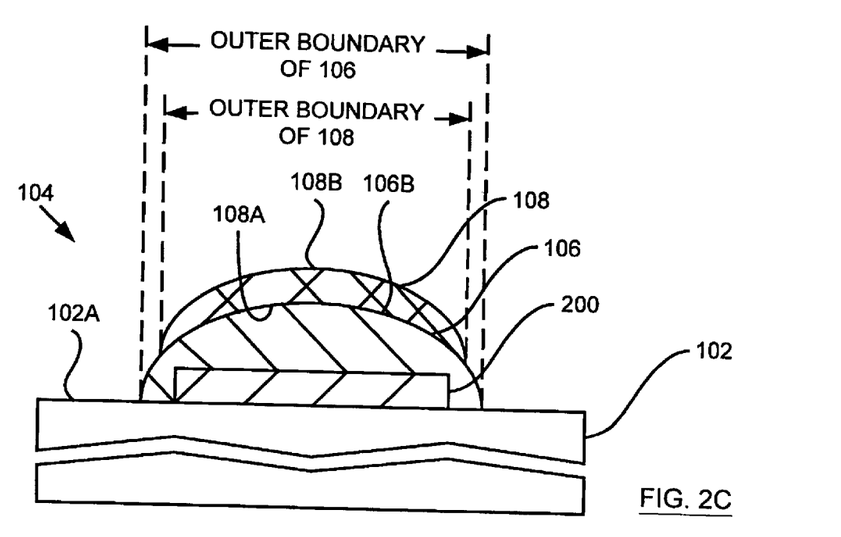
FIG. 2C is the cross-sectional view of the portion of the substrate of FIG. 2B, wherein the solderable capping layer of FIG. 1 has been formed on an upper surface of the compliant body.

FIGS. 2A–2C will now be used to describe one embodiment of a method for forming the compliant bumps 104 on the surface 102A of the substrate 102 of FIG. 1. FIG. 2A is a cross-sectional view of a portion of the substrate 102 of FIG. 1, wherein an I/O pad 200 has been formed on the surface 102A of the portion of the substrate 102. For example, the I/O pad 200 may be formed by patterning a layer of a metal (e.g., aluminum or copper) formed on the surface 102A of the substrate 102. The I/O pad 200 has two major surfaces: an underside surface 200A in contact with the surface 102A of the substrate 102, and an upper surface 200B opposite the underside surface 200A.

FIG. 2B is the cross-sectional view of the portion of the substrate 102 of FIG. 2A, wherein an electrically conductive, compliant body 106 (see FIG. 1) has been formed over the upper surface 200B of the I/O pad 200. The compliant electrical conductor may be selected from polymer based, electrically conductive materials. Such materials include thermoplastic, thermoset, and B-stageable materials. Common types of suitable polymer materials include epoxy, silicone, polyimide, and acrylate polymers and copolymers. The thermoplastic, thermoset, or B-stageable materials may require curing after application for the material to acquire a desired shape and form at room temperature.

Suitable electrical conductivity and stress dissipation of the compliant body 106 may be achieved by incorporating one or more metallic fillers, such as silver, gold, palladium, and alloys thereof. Inherently conductive polymer compositions are also known, and may be used. Commercially available filler material products include filler particles of various sizes and shapes. Such commercially available filler materials may be suitable.

The compliant body 106 may be formed by any one of several known methods, including screen printing, stencil printing, inkjet printing, sheet transfer of preformed bumps, coating followed by photoimaging, or photoimaging via multi-layer techniques. Regarding electrical conductivities of the compliant bodies 106, the achieved volume resistivity of the compliant bodies 106 should be less than or equal to about 0.001 ohm-cm, and preferably less than or equal to approximately 0.0001 ohm-cm. Regarding a lower limit for the volume resistivity, electrically conductive particle-filled compositions having volume resistivities as low as 0.00005 ohm-cm are attainable. Solid silver metal (99.78% pure) has a volume resistivity of 0.0000016 ohm-cm, which may be considered a practical lower limit of attainable volume resistivity.

In the embodiment of FIG. 2B, the compliant body 106 has an underside surface 106A in direct contact with the I/O pad 200, and an upper surface 106B opposite the I/O pad 200. The upper surface 106B of the compliant body 106 is shown having a domed shape. It is noted that the upper surface 106B of the compliant body 106 need not have a domed shape for compliant body 106 to perform its intended function.

In the embodiment of FIG. 2B, an outer boundary of the compliant body 106 extends beyond an outer boundary of the I/O pad 200 such that the compliant body 106 also contacts side surfaces 200C of the I/O pad 200 and a portion of the surface 102A of the substrate 102 surrounding the I/O pad 200. This arrangement may serve to increase the cross sectional area of the compliant body 106, thereby increasing the electrical conductivity of the complaint body 106. The increased cross sectional area may also increase dimensions of regions within the complaint body 106 in which thermo-mechanically induced stresses are elastically dissipated.

It is noted, however, that compliant body 106 need not contact any side surface 200C of the I/O pad 200, or any portion of the surface 102A of the substrate 102, to perform as intended. In other embodiments, the outer boundary of the compliant body 106 may not extend beyond an outer boundary of the I/O pad 200, defined by the side surfaces 200C of the I/O pad 200, such that the compliant body 106 does not contact any side surface 200C of the I/O pad 200, or any portion of the surface 102A of the substrate 102 surrounding the I/O pad 200.

FIG. 2C is the cross-sectional view of the portion of the substrate 102 of FIG. 2B, wherein an electrically conductive, solderable capping layer 108 (see FIG. 1) has been formed on the upper surface 106B of the compliant body 106. In the embodiment of FIG. 2C, the solderable capping layer 108 has an underside surface 108A in direct contact with the compliant body 106, and an upper surface 108B opposite the compliant body 106. As described above, the solderable capping layer 108 is "solder wettable." That is, molten solder coming in contact with exposed surfaces of the solderable capping layer 108 will adhere to those surfaces, thus allowing solder to be used to electrically and mechanically couple the solderable capping layer 108 to a corresponding bonding pad of an element (not shown) to which the apparatus 100 (FIG. 1) is to be connected.

The solderable capping layer 108 may be, for example, an alloy including two or more of the following metals: lead, tin, cadmium, indium, bismuth, and gallium. For example, the solderable capping layer 108 may be formed from an alloy including about 95 percent by weight lead and approximately 5 percent by weight tin (e.g., 5/95 percent by weight tin/lead solder). Where the solderable capping layer 108 is an alloy, suitable methods for forming the solderable capping layer 108 include stencil printing, inkjet printing, and transfer processing. Alternately, the solderable capping layer 108 may be formed from a material substantially comprising a single metal (e.g., copper, silver, platinum, palladium, or nickel). In this situation, the material may be deposited via electroplating.

The structure shown in FIG. 2C is one embodiment of the compliant bumps 104 of FIG. 1. When a body applies a force to the upper surface 108B of the solderable capping layer 108, the applied force is substantially transmitted to the compliant body 106. In response to the applied force, the compliant body 106 deforms, providing stress relief to the I/O pad 200. When the magnitude of the applied force is below a certain level (e.g., a threshold level), the compliant body 106 deforms in a substantially elastic manner under the applied force, and substantially recovers to its original size and shape when the applied force is removed. The compliant body 106 thus has a suitable measure of elasticity. A force is generated within the compliant body 106 that opposes the applied force and maintains physical contact between the solderable capping layer 108 and the body applying the applied force to the upper surface 108B of the solderable capping layer 108.

The Young's modulus of a material is a ratio of unidirectional internal stress within the material to an initial strain placed upon it. When the magnitude of the applied force is below the threshold level, the strain in the compliant body 106 produced by the applied force is substantially proportional to the applied stress, and the compliant body 106 is said to exhibit substantially "Hookean" or ideal elasticity. In one embodiment, the Young's modulus of the compliant body 106 may be less than or equal to about 8,000 MPa, and may be less than or equal to approximately 1,000 MPa. Compliant body 106 also has suitable measures of elongation and compressibility. Elongation is defined as the increase in a length of a specimen in tension, usually expressed as a percentage of the original length. Compressibility is defined as a decrease in a thickness of a specimen under compression, usually expressed as a percentage of the original thickness.

In the embodiment of FIG. 2C, an outer boundary of the solderable capping layer 108 is contained within an outer boundary of the compliant body 106, and the solderable capping layer 108 does not contact any portion of the surface 102A of the substrate 102 surrounding the compliant body 106. While this situation may be beneficial, it is not believed to be necessary for the resulting compliant bump 104 to perform as intended. Thus, in other embodiments, the outer boundary of the solderable capping layer 108 may extend beyond the outer boundary of the compliant body 106, and may contact a portion of the surface 102A of the substrate 102 surrounding the compliant body 106.

Figure 3A:
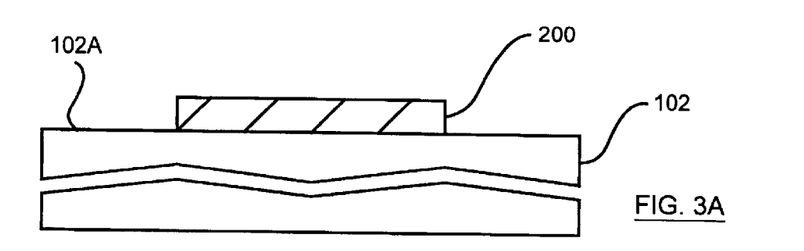
FIG. 3A is a cross-sectional view of a portion of the substrate of FIG. 1, wherein the I/O pad of FIG. 2A has been formed on the surface of the portion of the substrate.

FIGS. 3A–3D will now be used to describe a second embodiment of the method for forming the compliant bumps 104 on the surface 102A of the substrate 102 of FIG. 1. FIG. 3A is a cross-sectional view of a portion of the substrate 102 of FIG. 1, wherein the I/O pad 200 described above has been formed on the surface 102A of the portion of the substrate 102.

Figure 3B:
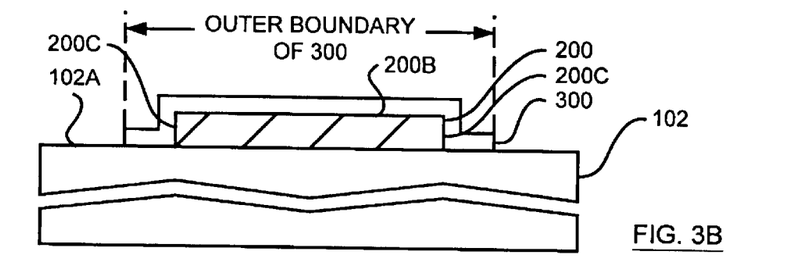
FIG. 3B is the cross-sectional view of the portion of the substrate of FIG. 3A, wherein an electrically conductive metal coating has been formed over upper and side surfaces of the I/O pad.

FIG. 3B is the cross-sectional view of the portion of the substrate 102 of FIG. 3A, wherein an electrically conductive metal coating 300 has been formed over the upper surface 200B and side surfaces 200C of the I/O pad 200. In the embodiment of FIG. 3B, an outer boundary of the conductive metal coating 300 extends beyond an outer boundary of the I/O pad 200, defined by the sides surfaces 200C of the I/O pad 200. The conductive metal coating 300 may serve as an adhesion layer, wherein a material subsequently formed on the conductive metal coating 300 adheres better to the conductive metal coating 300 than to the I/O pad 200. Alternately, or in addition, the conductive metal coating 300 may serve as a barrier layer to reduce oxidation of the I/O pad 200.

The conductive metal coating 300 may be formed by, for example, electroplating or evaporation (e.g., sputtering). The conductive metal coating 300 may include multiple layers of different metals. For example, the conductive metal coating 300 may be formed by forming layers of chromium, copper, and gold over the I/O pad 200 in that order (i.e., chrome/copper/gold layers). Alternatively, the conductive metal coating 300 may include chrome/silver/gold layers, or titanium/tungsten/gold layers. For example, the I/O pad 200 may be formed from aluminum, and the conductive metal coating 300 may be formed, for example, by forming a layer of chromium about 0.15 micron in thickness (i.e., an approximate 0.15 um chromium layer) over the I/O pad 200, followed by a 50/50 chromium copper layer approximately 0.15 um in thickness, followed by an approximate 1 um copper layer, followed by an approximate 0.15 um gold layer.

Figure 3C:
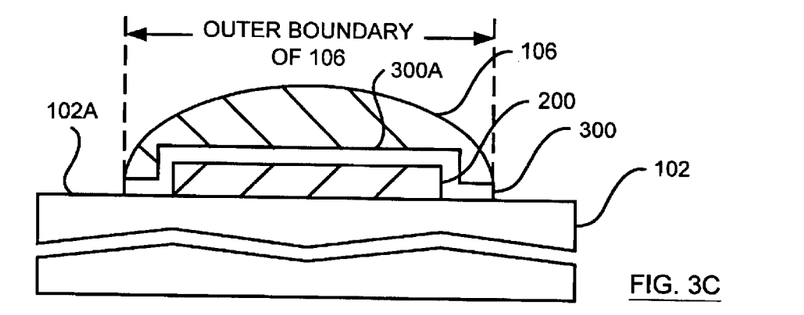
FIG. 3C is the cross-sectional view of the portion of the substrate of FIG. 3B, wherein the compliant body of FIG. 1 has been formed on an upper surface of the conductive metal coating.

FIG. 3C is the cross-sectional view of the portion of the substrate 102 of FIG. 3B, wherein the electrically conductive, compliant body 106 described above has been formed on an upper surface 300A of the conductive metal coating 300. It is noted that in the embodiment of FIG. 3C, an outer boundary of the compliant body 106 is contained within an outer boundary of the conductive metal coating 300 such that the compliant body 106 does not contact any portion of the surface 102A of the substrate 102 surrounding the conductive metal coating 300. In other embodiments, the outer boundary of the compliant body 106 may not be contained within the outer boundary of the conductive metal coating 300, and the compliant body 106 may contact a portion of the surface 102A of the substrate 102 surrounding the conductive metal coating 300.

Figure 3D:
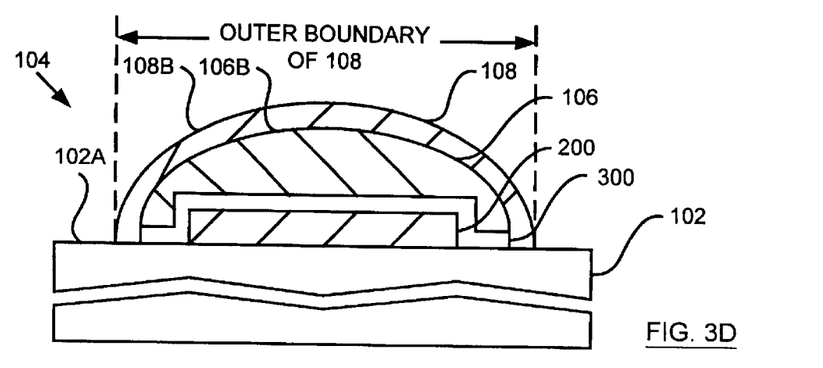
FIG. 3D is the cross-sectional view of the portion of the substrate of FIG. 3C, wherein the solderable capping layer of FIG. 1 has been formed over the upper surface of the compliant body.

FIG. 3D is the cross-sectional view of the portion of the substrate 102 of FIG. 3C, wherein the electrically conductive, solderable capping layer 108 described above has been formed over the upper surface 106B of the compliant body 106. In the embodiment of FIG. 3D, the solderable capping layer 108 completely envelopes the compliant body 106, the outer boundary of the solderable capping layer 108 extends beyond the outer boundary of the conductive metal coating 300, and the solderable capping layer 108 contacts the surface 102A of the substrate 102 surrounding the conductive metal coating 300.

The structure shown in FIG. 3D is a second embodiment of the compliant bumps 104 of FIG. 1. When a body applies a force to the upper surface 108B of the solderable capping layer 108, the applied force is substantially transmitted to the compliant body 106. In response to the applied force, the compliant body 106 deforms, providing stress relief to the I/O pad 200. When the magnitude of the applied force is below a certain level (e.g., a threshold level), the compliant body 106 deforms in a substantially elastic manner under the applied force, and substantially recovers to its original size and shape when the applied force is removed. The compliant body 106 thus has a suitable measure of elasticity. A force is generated within the compliant body 106 that opposes the applied force and maintains physical contact between the solderable capping layer 108 and the body applying the applied force to the upper surface 108B of the solderable capping layer 108.

Figure 4A:
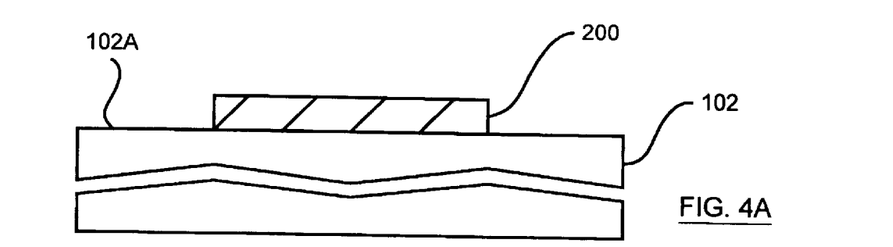
FIG. 4A is a cross-sectional view of a portion of the substrate of FIG. 1, wherein the I/O pad of FIG. 2A has been formed on the surface of the portion of the substrate.

FIGS. 4A–4D will now be used to describe a third embodiment of the method for forming the compliant bumps 104 on the surface 102A of the substrate 102 of FIG. 1. FIG. 4A is a cross-sectional view of a portion of the substrate 102 of FIG. 1, wherein the I/O pad 200 described above has been formed on the surface 102A of the portion of the substrate 102.

Figure 4B:
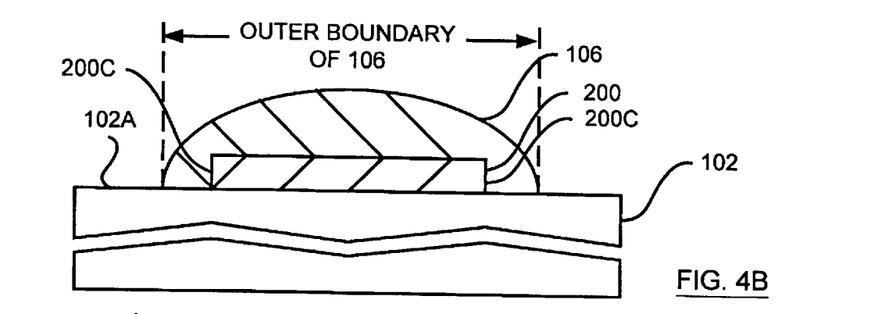
FIG. 4B is the cross-sectional view of the portion of the substrate of FIG. 4A, wherein the compliant body of FIG. 1 has been formed over the I/O pad.

FIG. 4B is the cross-sectional view of the portion of the substrate 102 of FIG. 4A, wherein the electrically conductive, compliant body 106 described above has been formed over the I/O pad 200. It is noted that in the embodiment of FIG. 4B, an outer boundary of the compliant body 106 extends beyond the outer boundary of the I/O pad 200, defined by the side surfaces 200C of the I/O pad 200, and contacts a portion of the surface 102A of the substrate 102 surrounding the I/O pad 200.

Figure 4C:
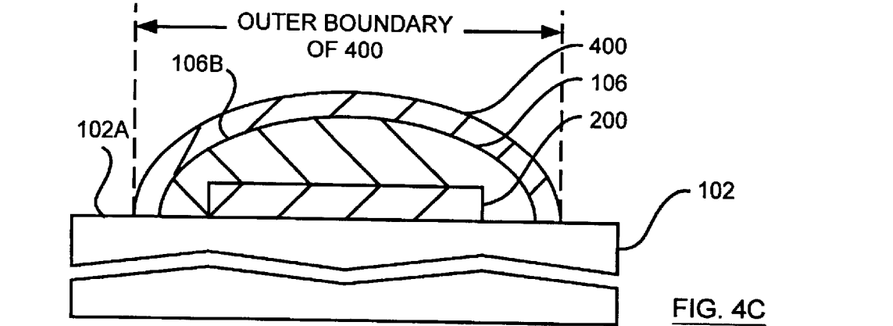
FIG. 4C is the cross-sectional view of the portion of the substrate of FIG. 4B, wherein an electrically conductive metal coating has been formed over an upper surface of the compliant body.

FIG. 4C is the cross-sectional view of the portion of the substrate 102 of FIG. 4B, wherein an electrically conductive metal coating 400 has been formed over the upper surface 106B of the compliant body 106. In the embodiment of FIG. 4C, the conductive metal coating 400 completely envelops the compliant body 106 and contacts a portion of the surface 102A of the substrate 102 surrounding the compliant body 106. The conductive metal coating 400 may serve as an adhesion layer wherein a material subsequently formed on the conductive metal coating 400 adheres better to the conductive metal coating 400 than to the compliant body 106. Alternately, or in addition, the conductive metal coating 400 may serve as a barrier layer to prevent chemical reactions between the subsequently formed layer and the compliant body 106 which may produce adverse products. The conductive metal coating 400 may include the same materials as the conductive metal coating 300 described above, and may be formed in the same way the conductive metal coating 300.

Figure 4D:
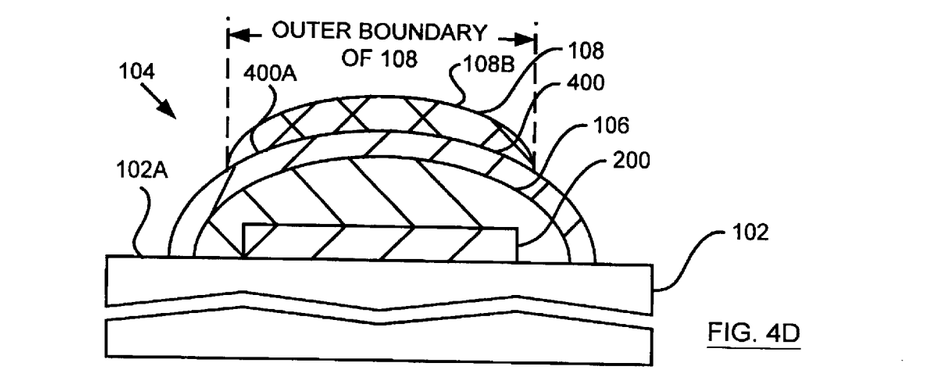
FIG. 4D is the cross-sectional view of the portion of the substrate of FIG. 4C, wherein the solderable capping layer of FIG. 1 has been formed over an upper surface of the conductive metal coating.

FIG. 4D is the cross-sectional view of the portion of the substrate 102 of FIG. 4C, wherein the electrically conductive, solderable capping layer 108 described above has been formed over an upper surface 400A of the conductive metal coating 400. In the embodiment of FIG. 4D, the outer boundary of the solderable capping layer 108 is contained within an outer boundary of the conductive metal coating 400 such that the solderable capping layer 108 does not contact the compliant body 106. This is believed to be beneficial where conductive metal coating 400 forms a barrier layer to prevent one or more chemical reactions between the solderable capping layer 108 and the compliant body 106 which may produce adverse products.

The structure shown in FIG. 4D is a third embodiment of the compliant bumps 104 of FIG. 1. When a body applies a force to the upper surface 108B of the solderable capping layer 108, the applied force is substantially transmitted to the compliant body 106. In response to the applied force, the compliant body 106 deforms, providing stress relief to the I/O pad 200. When the magnitude of the applied force is below a certain level (e.g., a threshold level), the compliant body 106 deforms in a substantially elastic manner under the applied force, and substantially recovers to its original size and shape when the applied force is removed. The compliant body 106 thus has a suitable measure of elasticity. A force is generated within the compliant body 106 that opposes the applied force and maintains physical contact between the solderable capping layer 108 and the body applying the applied force to the upper surface 108B of the solderable capping layer 108.

Figure 5A:
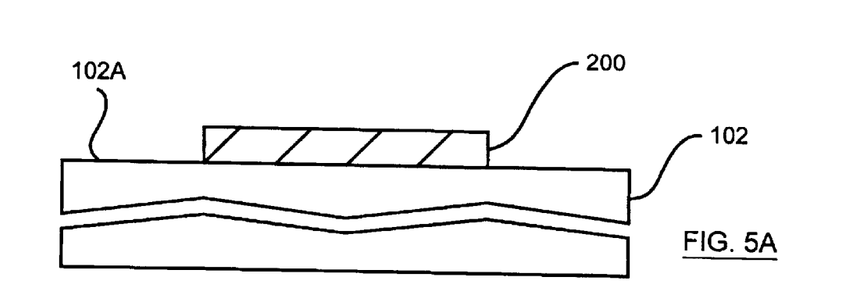
FIG. 5A is a cross-sectional view of a portion of the substrate of FIG. 1, wherein the I/O pad of FIG. 2A has been formed on the surface of the portion of the substrate.

FIGS. 5A–5E will now be used to describe a fourth embodiment of the method for forming the compliant bumps 104 on the surface 102A of the substrate 102 of FIG. 1. FIG. 5A is a cross-sectional view of a portion of the substrate 102 of FIG. 1, wherein the I/O pad 200 described above has been formed on the surface 102A of the portion of the substrate 102.

Figure 5B:
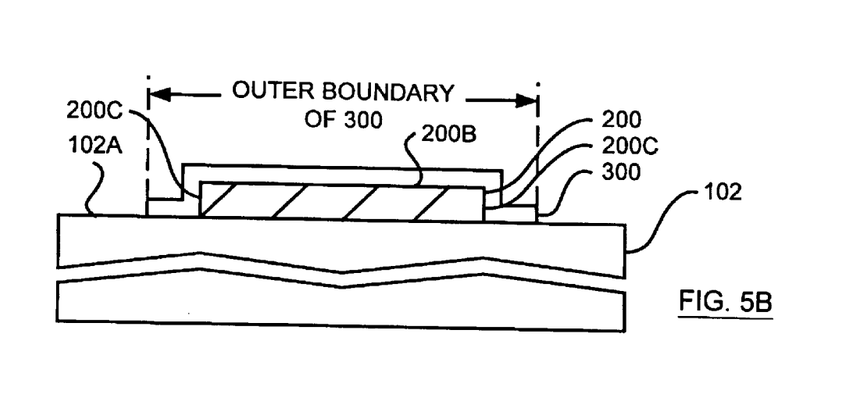
FIG. 5B is the cross-sectional view of the portion of the substrate of FIG. 5A, wherein the electrically conductive metal coating of FIG. 3B has been formed over the upper surface and side surfaces of the I/O pad.

FIG. 5B is the cross-sectional view of the portion of the substrate 102 of FIG. 5A, wherein the electrically conductive metal coating 300 described above has been formed over the upper surface 200B and side surfaces 200C of the I/O pad 200. In the embodiment of FIG. 5B, the outer boundary of the conductive metal coating 300 extends beyond an outer boundary of the I/O pad 200, defined by the sides surfaces 200C of the I/O pad 200. As described above, the conductive metal coating 300 may serve as an adhesion layer, wherein a material subsequently formed on the conductive metal coating 300 adheres better to the conductive metal coating 300 than to the I/O pad 200. Alternately, or in addition, the conductive metal coating 300 may serve as a barrier layer to reduce oxidation of the I/O pad 200.

Figure 5C:
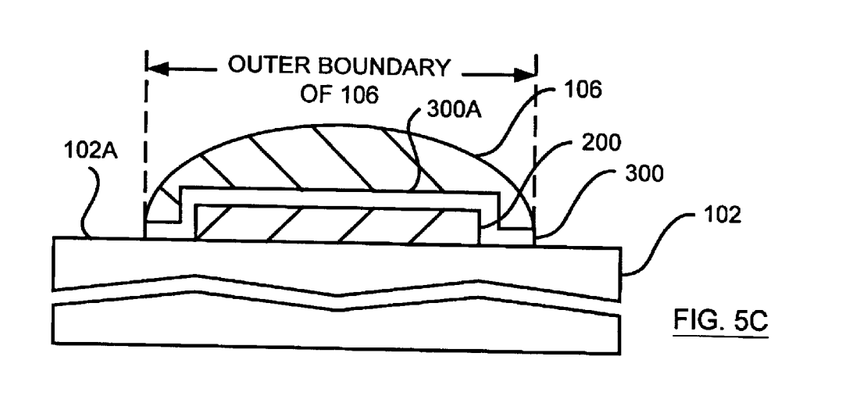
FIG. 5C is the cross-sectional view of the portion of the substrate of FIG. 5B, wherein the compliant body of FIG. 1 has been formed on the upper surface of the conductive metal coating of FIG. 3B.

FIG. 5C is the cross-sectional view of the portion of the substrate 102 of FIG. 5B, wherein the electrically conductive, compliant body 106 described above has been formed on the upper surface 300A of the conductive metal coating 300. It is noted that in the embodiment of FIG. 5C, an outer boundary of the compliant body 106 is contained within an outer boundary of the conductive metal coating 300 such that the compliant body 106 does not contact any portion of the surface 102A of the substrate 102 surrounding the conductive metal coating 300. In other embodiments, the outer boundary of the compliant body 106 may not be contained within the outer boundary of the conductive metal coating 300, and the compliant body 106 may contact a portion of the surface 102A of the substrate 102 surrounding the conductive metal coating 300.

Figure 5D:
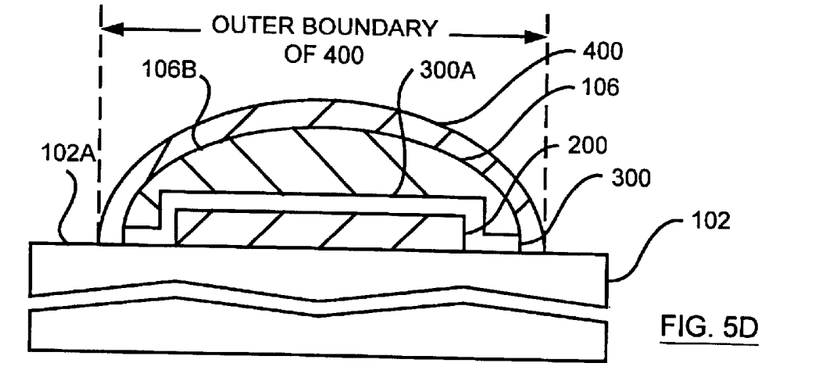
FIG. 5D is the cross-sectional view of the portion of the substrate of FIG. 5C, wherein the electrically conductive metal coating of FIG. 4C has been formed over the upper surface of the compliant body.

FIG. 5D is the cross-sectional view of the portion of the substrate 102 of FIG. 5C, wherein the electrically conductive metal coating 400 described above has been formed over the upper surface 106B of the compliant body 106. In the embodiment of FIG. 5D, the conductive metal coating 400 completely envelops the compliant body 106 and contacts a portion of the surface 102A of the substrate 102 surrounding the compliant body 106. As described above, the conductive metal coating 400 may serve as an adhesion layer wherein a material subsequently formed on the conductive metal coating 400 adheres better to the conductive metal coating 400 than to the compliant body 106. Alternately, or in addition, the conductive metal coating 400 may serve as a barrier layer to prevent chemical reactions between the subsequently formed layer and the compliant body 106 which may produce adverse products. The conductive metal coating 400 may include the same materials as the conductive metal coating 300 described above, and may be formed in the same way the conductive metal coating 300.

Figure 5E:
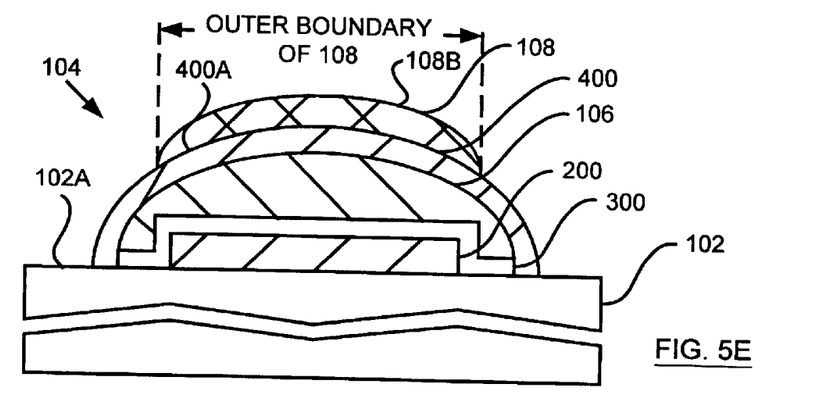
FIG. 5E is the cross-sectional view of the portion of the substrate of FIG. 5D, wherein the solderable capping layer of FIG. 1 has been formed over the upper surface of the conductive metal coating of FIG. 4C.

FIG. 5E is the cross-sectional view of the portion of the substrate 102 of FIG. 5D, wherein the electrically conductive, solderable capping layer 108 described above has been formed over the upper surface 400A of the conductive metal coating 400. In the embodiment of FIG. 5E, the outer boundary of the solderable capping layer 108 is contained within the outer boundary of the conductive metal coating 400 (see FIG. 5D) such that the solderable capping layer 108 does not contact the compliant body 106. This is believed to be beneficial where conductive metal coating 400 forms a barrier layer to prevent one or more chemical reactions between the solderable capping layer 108 and the compliant body 106 which may produce adverse products.

The structure shown in FIG. 5E is a fourth embodiment of the compliant bumps 104 of FIG. 1. As described above, when a body applies a force to the upper surface 108B of the solderable capping layer 108, the applied force is substantially transmitted to the compliant body 106. In response to the applied force, the compliant body 106 deforms, providing stress relief to the I/O pad 200. When the magnitude of the applied force is below a certain level (e.g., a threshold level), the compliant body 106 deforms in a substantially elastic manner under the applied force, and substantially recovers to its original size and shape when the applied force is removed. A force is generated within the compliant body 106 that opposes the applied force and maintains physical contact between the solderable capping layer 108 and the body applying the applied force to the upper surface 108B of the solderable capping layer 108.

It is noted that the components of the compliant bumps 104 (e.g., compliant bodies 106, solderable capping layers 108, etc.) may have any suitable shape.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for forming a compliant electrical terminal on an upper surface of an electrical conductor, comprising:

forming an electrically conductive, compliant body over the upper surface of the electrical conductor such that an outer boundary of the compliant body extends beyond an outer boundary of the electrical conductor, and wherein the compliant body is electrically coupled to the electrical conductor;

forming an electrically conductive metal coating over the compliant body such that the conductive metal coating is electrically coupled to the compliant body, wherein an outer boundary of the conductive metal coating extends beyond an outer boundary of the compliant body, and wherein the conductive metal coating functions as either an adhesion layer or a barrier layer; and forming an electrically conductive, solderable capping layer over the conductive metal coating such that the solderable capping layer is electrically coupled to the conductive metal coating.

2. The method as recited in claim 1, wherein the forming of the electrically conductive metal coating comprises:

forming an electrically conductive metal coating over the compliant body such that the conductive metal is electrically coupled to the compliant body, wherein an outer boundary of the conductive metal coating extends beyond an outer boundary of the compliant body, and wherein the conductive metal coating functions as either an adhesion layer or a barrier layer, and wherein the conductive metal coating comprises at least one layer of a metal selected from the group consisting of: chrome, copper, gold, silver, titanium, and tungsten.

3. The method as recited in claim 1, wherein the forming of the electrically conductive, solderable capping layer comprises:

forming an electrically conductive, solderable capping layer over the conductive metal coating such that the solderable capping layer is electrically coupled to the conductive metal coating, wherein the solderable capping layer comprises at least one metal selected from the group consisting of: lead, tin, cadmium, indium, bismuth, gallium, copper, silver, platinum, palladium, and nickel.

4. A method for forming a compliant electrical terminal on an upper surface of an electrical conductor, comprising:

forming a first electrically conductive metal coating over the upper surface of the electrical conductor such that the conductive metal is electrically coupled to the electrical conductor, wherein an outer boundary of the conductive metal coating extends beyond an outer boundary of the electrical conductor, and wherein the conductive metal coating functions as either an adhesion layer or a barrier layer;

forming an electrically conductive, compliant body over the upper surface of the electrical conductor such that an outer boundary of the compliant body extends beyond an outer boundary of the electrical conductor, and wherein the compliant body is electrically coupled to the electrical conductor;

forming a second electrically conductive metal coating over the compliant body such that the conductive metal coating is electrically coupled to the compliant body, wherein an outer boundary of the conductive metal coating extends beyond an outer boundary of the compliant body, and wherein the conductive metal coating functions as either an adhesion layer or a barrier layer; and forming an electrically conductive, solderable capping layer over the second conductive metal coating such that the solderable capping layer is electrically coupled to the second conductive metal coating.

5. The method as recited in claim 4, wherein the forming of the first electrically conductive metal coating comprises:

forming a first electrically conductive metal coating over the upper surface of the electrical conductor such that the conductive metal is electrically coupled to the electrical conductor, wherein an outer boundary of the conductive metal coating extends beyond an outer boundary of the electrical conductor, and wherein the conductive metal coating functions as either an adhesion layer or a barrier layer, and wherein the conductive metal coating comprises at least one layer of a metal selected from the group consisting of: chrome, copper, gold, silver, titanium, and tungsten.

6. The method as recited in claim 4, wherein the forming of the second electrically conductive metal coating comprises:

forming a second electrically conductive metal coating over the compliant body such that the conductive metal is electrically coupled to the compliant body, wherein an outer boundary of the conductive metal coating extends beyond an outer boundary of the compliant body, and wherein the conductive metal coating functions as either an adhesion layer or a barrier layer, and wherein the conductive metal coating comprises at least one layer of a metal selected from the group consisting of: chrome, copper, gold, silver, titanium, and tungsten.

7. The method as recited in claim 4, wherein the forming of the electrically conductive, solderable capping layer comprises:

forming an electrically conductive, solderable capping layer over the second conductive metal coating such that the solderable capping layer is electrically coupled to the second conductive metal coating, wherein the solderable capping layer comprises at least one metal selected from the group consisting of: lead, tin, cadmium, indium, bismuth, gallium, copper, silver, platinum, palladium, and nickel.

* * * * *